(12) United States Patent
Van Zeghbroeck et al.

(10) Patent No.: US 7,508,000 B2
(45) Date of Patent: Mar. 24, 2009

(54) METHOD OF FABRICATING SELF-ALIGNED SILICON CARBIDE SEMICONDUCTOR DEVICES

(75) Inventors: Bart J. Van Zeghbroeck, Boulder, CO (US); John T. Torvik, Louisville, CO (US)

(73) Assignee: Microsemi Corporation, Bend, OR (US)

( * ) Notice: Subject to any disclaimer, the term of this patent is extended or adjusted under 35 U.S.C. 154(b) by 49 days.

(21) Appl. No.: 10/997,057

(22) Filed: Nov. 24, 2004

(65) Prior Publication Data

US 2005/0260821 A1 Nov. 24, 2005

Related U.S. Application Data

(63) Continuation of application No. 10/895,017, filed on Jul. 20, 2004, now abandoned, which is a continuation of application No. 10/360,662, filed on Feb. 7, 2003, now Pat. No. 6,764,907.

(60) Provisional application No. 60/358,440, filed on Feb. 19, 2002, provisional application No. 60/358,318, filed on Feb. 19, 2002.

(51) Int. Cl.
*H01L 29/15* (2006.01)
*H01L 29/36* (2006.01)

(52) U.S. Cl. .................... 257/77; 257/E29.297

(58) Field of Classification Search ................. 438/105; 257/77, E29.297
See application file for complete search history.

(56) References Cited

U.S. PATENT DOCUMENTS

| | | | |
|---|---|---|---|
| 4,945,394 A | 7/1990 | Palmour et al. | ................ 357/34 |
| 5,266,503 A | 11/1993 | Wang et al. | ................... 437/24 |
| H1637 H | 3/1997 | Offord et al. | ................ 437/173 |
| 5,914,611 A | 6/1999 | Cheng | ......................... 324/719 |
| 6,121,633 A * | 9/2000 | Singh et al. | .................... 257/77 |
| 6,180,958 B1 | 1/2001 | Cooper, Jr. | .................... 257/77 |
| 6,181,200 B1 | 1/2001 | Titizian et al. | ................ 330/66 |
| 6,218,254 B1 | 4/2001 | Singh et al. | ................. 438/364 |
| 6,228,665 B1 | 5/2001 | Griffith et al. | ................. 438/14 |

(Continued)

OTHER PUBLICATIONS

Article entitled "Silicon Carbide Bipolar Transistor" by W. V. Munch and P. Hoeck, published in *Solid State Electronics*, 1978, vol. 21, pp. 479-480, Pergamon Press, Great Britain.

(Continued)

*Primary Examiner*—W. David Coleman
(74) *Attorney, Agent, or Firm*—Bobby B. Soltani; Marsh Fischmann & Breyfogle LLP

(57) ABSTRACT

Methods of constructing silicon carbide semiconductor devices in a self-aligned manner. According to one aspect of the invention, the method may include forming a mesa structure in a multi-layer laminate including at least a first and second layer of silicon carbide material. The mesa structure may then be utilized in combination with at least one planarization step to construct devices in a self-aligned manner. According to another aspect of the present invention, the mesa structure may be formed subsequent to an ion implantation and anneal steps to construct devices in a self-aligned manner. According to another aspect of the present invention, a high temperature mask capable of withstanding the high temperatures of the anneal process may be utilized to form devices in a self-aligned manner.

25 Claims, 20 Drawing Sheets

U.S. PATENT DOCUMENTS

| | | | |
|---|---|---|---|
| 6,303,475 B1 | 10/2001 | Suvorov et al. | 438/519 |
| 6,313,482 B1 | 11/2001 | Baliga | 257/77 |
| 6,323,506 B1 | 11/2001 | Alok | 257/77 |
| 6,329,675 B2 | 12/2001 | Singh et al. | 257/77 |
| 6,331,931 B1 | 12/2001 | Titizian et al. | 361/306.3 |
| 2003/0157745 A1 | 8/2003 | Zeghbroeck et al. | |
| 2004/0082191 A1 | 4/2004 | Zeghbroeck et al. | |

OTHER PUBLICATIONS

Excerpt from textbook entitled Volume V *Introduction to Microelectronic Fabrication*, pp. 71-73, author Richard C. Jaeger, Auburn University, published by Addison-Wesley Publishing Company, reprinted with corrections May 1993.

\* cited by examiner

METHOD OF FABRICATING SELF-ALIGNED SILICON CARBIDE SEMICONDUCTOR DEVICES

RELATED APPLICATIONS

This patent application is a continuation of U.S. patent application Ser. No. 10/895,017, which was filed on Jul. 20, 2004, now abandoned entitled "METHOD OF FABRICATING SELF-ALIGNED SILICON CARBIDE SEMICONDUCTOR DEVICES," which is a continuation of U.S. patent application Ser. No. 10/360,662, which was filed on Feb. 7, 2003 and issued on Jul. 20, 2004 as U.S. Pat. No. 6,764,907, entitled "METHOD OF FABRICATING SELF-ALIGNED SILICON CARBIDE SEMICONDUCTOR DEVICES," which, in turn, claims priority from U.S. Patent Application Ser. No. 60/358,318 which was filed on Feb. 19, 2002, entitled "BIPOLAR TRANSISTOR WITH SELF-ALIGNED ION IMPLANTED BASE CONTACT," and from U.S. Patent Application Ser. No. 60/358,440, also filed on Feb. 19, 2002, entitled "BIPOLAR TRANSISTOR WITH REGROWN BASE CONTACT". The entire disclosures of these patents are all incorporated herein by reference.

FIELD OF THE INVENTION

The present invention generally relates to silicon carbide (SiC) semi-conductor devices, and in particular, to methods of forming self-aligned SiC devices.

BACKGROUND OF THE INVENTION

Silicon carbide is a semiconductor material with desirable material properties for constructing power devices. These material properties include among other things, a wide bandgap, a high thermal conductivity, high breakdown field strength, and a high electron saturation velocity. One example of such a power device is a bipolar junction transistor (BJT). BJT's are well-known and frequently used semiconductor devices that are generally defined by two back-to-back p-n junctions formed in a semiconductor material in close proximity. In operation, current enters a region of the semiconductor material adjacent one of the p-n junctions called the emitter. Current exits the device from a region of the material adjacent the other p-n junction called the collector. The collector and emitter have the same conductivity type and include a thin layer of semiconductor material having the opposite conductivity positioned between them, referred to as the base.

One of the requirements for an operable and useful BJT device is an appropriate semiconductor material from which it can be formed. The most commonly used material is silicon (Si), with recent attention being paid to materials such as gallium arsenide (GaAs) and indium phosphide (InP). While the potential of SiC is recognized, appropriate techniques for producing devices is lacking, because the requirements of specific devices, such as devices utilized in radio frequency (RF) applications, are often difficult to achieve using SIC. For instance, performance optimization in a device, such as a BJT for an RF power amplifier, requires minimizing base resistance, maximizing power densities, and minimizing parasitics. To accomplish these characteristics, the geometry and spacing of the base and the emitter, as well their respective contacts must be carefully controlled. Furthermore, such devices require careful control of the conductivity and thickness of the emitter, base, and collector layers, as well as the parasitic base-collector capacitance to achieve desired oscillation frequencies and power gains. In the case of a device, such as a BJT made from SiC, the high base sheet resistance and difficulty in making low-resistivity ohmic contacts, (due to the large mismatch between the valence band energy of SiC and the work function of common metals), makes such devices difficult to produce.

To achieve the above-described geometries and spacing in a SiC device, it is desirable to construct the device in a self-aligned manner. Self-alignment in this context means that the relative spacing of features of the device, such as contacts, is automatically controlled by the processing sequence and process parameters, rather than by the careful alignment prior to exposure of a photo sensitive layer. Unfortunately, self-alignment is problematic in SiC devices due to the high processing temperatures typically involved. For example, ion implantation of a highly-doped contact region to form a self-aligned contact layer is the commonly utilized approach in the semiconductor industry to achieve self-alignment. This approach typically utilizes an implant mask to define the ion implanted regions of the device. However, when this technique is applied to SiC devices, the subsequent anneal process required to restore the crystal structure after implantation must be performed at very high temperatures (generally 1400-1800° C.). Such high temperatures require that the masking material utilized for the implantation be removed during the anneal process such that the implant mask can no longer be used to self-align other features of the device.

SUMMARY OF THE INVENTION

In view of the foregoing, a primary object of the present invention is to provide improved methods of forming SiC devices. Another object of the present invention is to provide improved methods of forming self-aligned SiC devices. Another object of the present invention is to provide improved methods of forming self-aligned contacts on SiC devices. Another object of the present invention is to improve SiC device performance. A related object of the present invention is to provide improved SiC devices configured for operation in applications including without limitation, RF power transistors. Another object of the present invention is to increase power densities, optimize doping densities, and minimize parasitics in SiC devices.

One or more of the above objectives and additional advantages may be realized by a first aspect of the present invention, which provides a method of forming a self-aligned SiC device. The method includes the steps of providing a multi-layer laminate including at least a first and second layer of SiC material, defining at least one mesa structure in one of the first and second layers, and utilizing the mesa structure and at least one planarization step to construct the device in a self-aligned manner. According to this method, SiC devices including without limitation a junction, a transistor, a diode, thyristor, etc. may be formed in a self-aligned manner.

Various refinements exist of the features noted in relation to the subject first aspect of the present invention. Further features may also be incorporated in the subject first aspect as well. These refinements and additional features may exist individually or in any combination. For instance, the defining step may include the steps of forming a first and second mask on the one of the first and second layers and etching the mesa structure using the second mask. Subsequent to removal of the second mask, the method may include the step of ion implanting a first portion of the multi-layer laminate to produce a first doped portion using the first mask. In this regard, the method may further include the step of forming sidewalls on the emitter mesa prior to the ion implantation and using the sidewalls and the first mask to define the first doped portion.

According to another feature, the present method may further include the steps of forming second sidewalls on the first sidewalls and ion implanting a second portion of the multi-layer laminate using the second sidewalls to define a second doped portion. In one example, of a BJT device produced according to the present method, the second doped portion includes a higher doping density than the first doped portion to reduce the base-collector capacitance.

According to a first embodiment of the present method, the mask material is removed prior to annealing the device. In this regard, subsequent to removal of the mask material, the method includes the step of annealing the multi-layer laminate to restore the crystal structure. According to a second embodiment of the present method, the mask material comprises a material, e.g. carbon, diamond, tungsten etc., capable of withstanding the high temperatures, e.g. generally 1400-1800° C., of the anneal process. In this case, the mask material is not removed prior to the annealing step, and may be utilized subsequent to the annealing step, to construct the device in the self-aligned manner.

According to another feature, the present method may further include the steps of forming sidewalls on the mesa structure and conformally depositing a contact metal layer on the multi-layer laminate. The contact metal layer may then be formed into self-aligned contact areas using planarization. In this regard, the method may further include the steps of conformally depositing a planarization layer on the contact metal layer and removing a portion of the planarization layer to expose a portion of the first contact metal layer. The exposed contact metal may then be removed to form contact areas in the non-removed portions of the device, followed by removal of the remaining planarization layer.

According to another feature, the present method may further include the steps of conformally depositing another planarization layer on the multi-layer laminate and removing a portion of the second planarization layer to expose the mesa structure and a portion of the first sidewalls. This in turn permits a second contact to be formed on the mesa structure in a self-aligned manner through deposition of the contact metal on the exposed mesa structure. The remaining planarization layer may then be removed to complete fabrication of the device.

One or more of the above objectives and additional advantages may be realized by a second aspect of the present invention, which provides a method of forming a self-aligned SiC device. The method includes the steps of providing a multi-layer laminate including at least a first and second layer of SiC material, forming at least one mask on one of the first and second layers, defining at least one mesa structure in one of the first and second layers, and ion implanting a first portion of one of the first and second layers using the at least one mask. The method further includes the steps of annealing the multi-layer structure and utilizing the at least one mask subsequent to the annealing step to construct the device in a self-aligned manner. As with the above method this method permits construction of SiC devices including without limitation a junction, a transistor, a diode, thyristor, etc. in a self-aligned manner.

Various refinements exist of the features noted in relation to the subject second aspect of the present invention. Further features may also be incorporated in the subject second aspect as well. These refinements and additional features may exist individually or in any combination. For instance, as noted above, the defining step may include forming a first and second mask and etching the mesa structure using the second mask. Subsequent to removal of the second mask, the method may include the step of ion implanting at least a first portion of the multi-layer laminate, and preferably a second portion of the multi-layer laminate, to define first and second doped portions.

According to the present method, however, at least one of the first and second mask materials comprise a material, e.g. carbon, diamond, tungsten etc., capable of withstanding the high temperatures, e.g. generally 1400-1800° C., of the anneal process such that mask is not removed prior to the annealing step, and may be utilized subsequent to the annealing step, to construct the device in the self-aligned manner.

One or more of the above objectives and additional advantages may be realized by a third aspect of the present invention, which provides a method of forming a self-aligned SiC device. The method includes the steps of providing a multi-layer laminate including at least a first and second layer of SiC material, ion implanting a portion of one of the first and second layers, and annealing the multi-layer laminate. Subsequent to the anneal step, the method comprises defining at least one mesa structure in one of the first and second layers. As with the above methods this method further permits construction of SiC devices including without limitation a junction, a transistor, a diode, thyristor, etc. in a self-aligned manner.

Various refinements exist of the features noted in relation to the subject third aspect of the present invention. Further features may also be incorporated in the subject third aspect as well. These refinements and additional features may exist individually or in any combination. For instance, the method may further include the steps of oxidizing the multi-layer laminate and removing a portion of the oxide to expose the mesa structure. According to this characterization, the oxidation process results in a thick oxide layer in the implant regions and a thinner oxide layer in the non-implanted regions due to the high doping density of the implanted regions. This in turn permits removal of the implanted portion of the emitter layer, leaving only the non-implanted portion, which in turn forms the mesa structure. Furthermore, the oxide layer may be utilized to self-align the emitter and base contacts on the device. For instance, the method may further include the steps of depositing a contact metal on the exposed portion of the mesa structure, removing a remaining portion of the oxide, and depositing a wiring metal on the multi-layer laminate to complete the device. Furthermore, additional aspects, advantages and applications of the present invention will be apparent to those skilled in the art upon consideration of the following.

DETAILED DESCRIPTION

Figure 1:
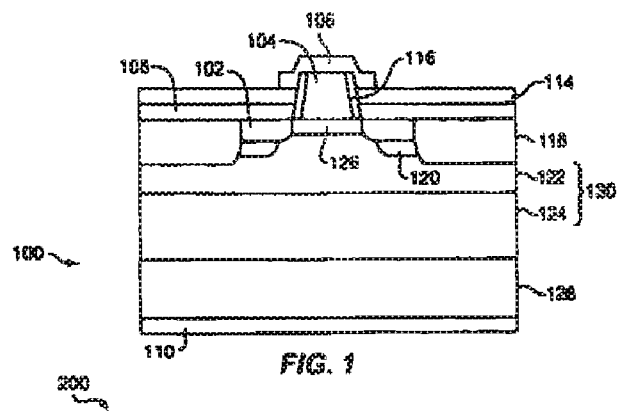
FIG. 1 is a cross sectional schematic view of an SiC-based BJT structure formed in accordance with the present invention.

Reference will now be made to the accompanying drawings, which at least assist in illustrating the various pertinent features of the present invention. In this regard, the following description is presented for purposes of illustration and description and is not intended to limit the invention to the form disclosed herein. Consequently, variations and modifications commensurate with the following teachings, and skill and knowledge of the relevant art, are within the scope of the present invention. The embodiments described herein are further intended to explain the best modes known of practicing the invention and to enable others skilled in the art to utilize the invention in such, or other embodiments and with various modifications required by the particular application(s) or use(s) of the present invention. As such, the following description sets forth an exemplary SiC BJT structure and associated self-alignment processes as well as other features and advantages commensurate with the present invention.

As noted above, a difficulty associated with forming self-aligned SiC devices relates to the high temperature annealing process required when ion implantation is utilized to form a base contact area. In this case, the mask materials cannot withstand the high temperatures and therefore are not usable to align the emitter and base contacts. Accordingly, in one embodiment, the present invention addresses this apparent obstacle through use of an implant mask to form an emitter mesa structure. According to this characterization, the emitter mesa structure may then be utilized in combination with a planarization process to obtain a self-aligned device including self-aligned base and emitter contacts. According to another embodiment, the present invention addresses this apparent obstacle through use of a masking material that is able to withstand the high temperature anneal. Accordingly the need to remove the mask material prior to the anneal process is eliminated, thereby permitting utilization of the masking material to obtain a self-aligned device, including self-aligned base and emitter contacts. According to yet another embodiment, the present invention addresses this apparent obstacle by performing the implantation and anneal prior to forming the emitter mesa. Subsequent to the implantation and anneal, an oxidation process may be utilized to form the emitter mesa. Specifically, the oxidation process results in a thick oxide layer in the implant regions and a thinner oxide layer in the non-implanted regions due to the high doping density of the implanted regions. This in turn permits removal of the implanted portion of the emitter layer, leaving only the non-implanted portion, which in turn forms the mesa structure. Furthermore, the oxide layer may be utilized to self-align the emitter and base contacts on the device. Advantageously, the above described techniques result in self-aligned devices having reduced base contact resistance for the formation of ohmic contacts with low specific contact resistivity.

By way of background, an ohmic contact is a metal semiconductor contact having negligible contact resistance relative to the bulk or spreading resistance of the semiconductor device. For example, an ohmic contact may be a resistive contact area that permits a metal, such as aluminum, to be used as an interconnecting metal from one region to another. It is generally required, however, that an ohmic contact not change the performance of a device, which it is a part of, where a voltage drop across the ohmic contact is small, compared to a voltage drop across an active region of the device.

Referring to FIG. 1, the following description discloses an example of a SiC device, namely BJT transistor 100, and methods of making the same. It will be appreciated that the present example is provided for purpose of illustration and that other devices are possible and contemplated in accordance with the present invention. For instance, one skilled in the art will readily appreciate that the described principles may be applied to construct devices such as a junction, a diode, a thyristor, or a transistor from SiC.

Advantageously, the present methods are particularly useful in forming discrete wide bandwidth SiC BJTs for use in devices such as RF power amplifiers for wireless communication and radar purposes, as well as lower-frequency power devices for applications such as in power conditioning and traction control. Accordingly, the transistor 100 includes an emitter contact metal 106 and an ion-implanted contact layer 102 which are both self-aligned to an emitter mesa 104. Advantageously, the self-alignment of these features, minimizes base resistance for the formation of ohmic contacts and facilitates the fabrication of a quality device having micron and/or sub-sized emitter stripe widths.

The transistor 100 also includes a self-aligned base contact 108 and an isolation layer 118. Advantageously, the isolation layer 118 minimizes the base contact layer area 102 by permitting the base contact metal 108 to extend onto the isolation layer 118. Also advantageously, the transistor 100 includes a buried oxide layer 120 underneath the base contact layer 102. Preferably, the oxide layer 120 is ion-implanted with a higher implant energy and dose than the base contact layer 102. This in turn reduces the base-collector capacitance due to the lower dielectric constant of the oxide layer 120 relative to that of silicon carbide.

Planarization Using the Emitter Mesa.

According to a first embodiment of the present invention, the emitter mesa 104 may be used in combination with a planarization process to self-align the device 100 including self-alignment of the emitter and base contacts 106 and 108 respectively. The transistor 100 includes three distinct semiconductor regions formed from SiC, namely, an emitter, e.g. emitter mesa 104, a base 126, and a collector 130 (including collector layer 122 and subcollector layer 124). The transistor 100 also includes a substrate 128, collector contact 110, and the emitter and base contacts 106 and 108. According to one embodiment of the transistor 100 that is especially useful for RF applications, the base layer 126 may be a thin and heavily doped layer, e.g. having a nominal thickness of less than 200 nm and a doping density in the range of $2\text{-}8\times10^{18}$ cm$^{-3}$. According to this characterization, the thickness and doping of the emitter layer 104 may be 200 nm and $1\times10^{19}$ to $4\times10^{19}$ cm$^{-3}$ respectively, while the thickness and doping of the collector layer 130 may be 1000 nm to 3000 nm and $2\times10^{15}$ to $8\times10^{16}$ cm$^{-3}$ respectively.

Unless otherwise specified, the forming processes involved in fabricating the device 100 may include, but are not limited to, various CVD processes such as microwave plasma CVD, RF plasma CVD, photo-CVD, thermal CVD, and MOCVD, various deposition processes such as electron beam evaporation, and sputtering, among others, as well as various etch processes including reactive ion etching and high temperature anneal and oxidation processes. In this regard, the transistor 100 can be made both with n-p-n and/or p-n-p conductivity type for the emitter layer 104, base layer 126, and collector layer 130 respectively, but the n-p-n structure is preferred as it includes superior transport properties due to higher electron mobility compared to hole mobility. It should also be noted that SIC crystallizes in over 150 polytypes or crystal structures, although the most common structures include those known as 3C, 4H, and 6H, where "C" means 'cubic' and "H" means 'hexagonal.' While the principles of the present invention apply equally to at least those structures known as 3C, 4H, and 6H, preferably for RF applications, a BJT made from 4H SiC is deemed the most useful, as 4H-SiC includes higher electron mobility along the C-axis, e.g. as compared to 6H-SiC. Furthermore, it should be noted that the multiplayer devices disclosed herein may include layers of different polytypes.

According to this embodiment, the process begins with the etching of the emitter mesa 104, followed by an implantation of the base contact layer 102 using the same mask. This results in the base contact layer 102 being self-aligned with respect to the emitter mesa 104, which in turn results in a low resistance contact to the base region 126 underneath the emitter mesa 104. The implant mask may then be removed and the implanted region annealed in, for example, a silan atmosphere in the temperature range of 1400-1800° C.

The structure may then be thermally oxidized to form a thin protective oxide. Subsequently, the base contact 108 may be formed on the base contact layer 102 by first etching the protective oxide in the appropriate regions, followed by a deposition of the base contact metal, e.g. Ti/Al. A self-aligned emitter contact 106 is obtained by planarzing the structure with a layer of polyamide. The polyamide may be cured at for example 200° C., causing it to flow, thereby resulting in a minimal surface topology despite the presence of the emitter mesa 104. The layer of polyamide may then be thinned, for example by oxygen RIE (reactive ion etching), until the emitter mesa 104 is exposed. A wider emitter contact metal 106 may then be deposited on top of the emitter mesa 104 in a self-aligned manner. Alternatively, the structure may be first coated with a polyamide, photoresist, or SOG layer, which is then polished back to expose the emitter mesa 104.

Figure 2:
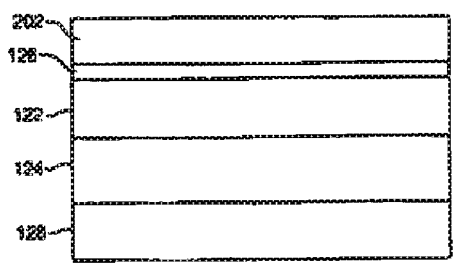
FIGS. 2-26 illustrate, in step-by-step fashion, a process for forming the device of FIG. 1.
Figure 2A:
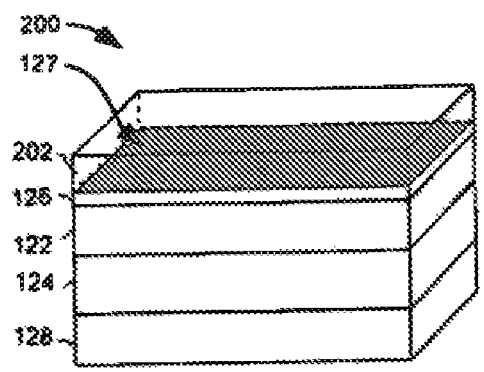
Figure 3:
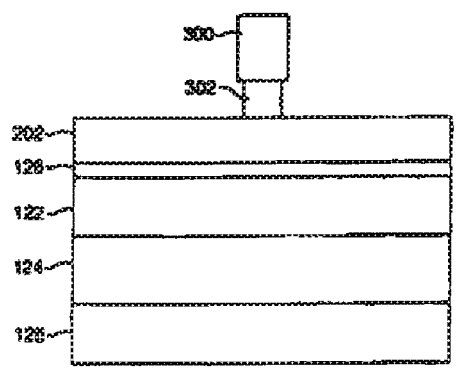

A generally corresponding process is shown in step-by-step fashion in FIGS. 2-26. The process begins with the formation of an epitaxially grown SiC stack 200, illustrated in FIG. 2. The stack 200 includes the n-type SIC substrate 128, the n-type SiC collector layers 122 and 124, the p-type base layer 126, and an n-type emitter layer 202 from which the emitter mesa 104 is formed. As shown in FIGS. 2A and 4A, a transition surface 127 is formed by the top surface of the base layer 126 and the bottom surface of the emitter layer 202. FIG. 3 illustrates a photoresist mask 300 and an oxide implant mask 302, e.g. $SiO_2$ formed on the stack 200. The masks 300 and 302 may be formed by conventional photolithographic processing, such as by using an exposure tool and mask.

Figure 4:
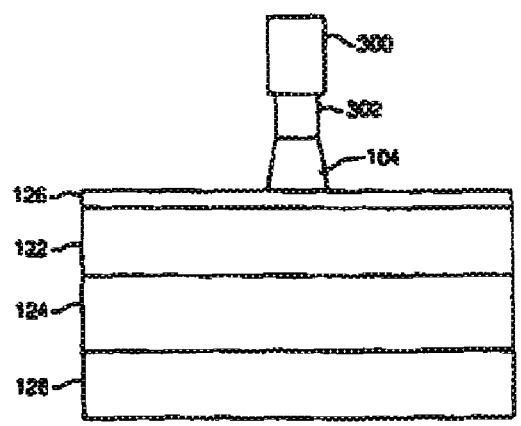
Figure 4A:
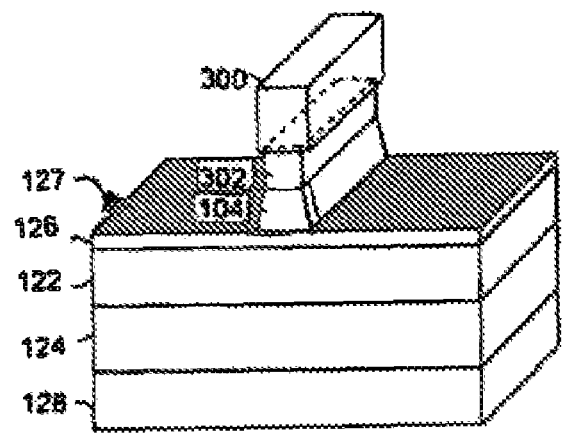

As shown in FIG. 4, an etching, such as RIE, or similar process, may be used to remove a portion of the n-type emitter layer 202 to form the emitter mesa 104. As will be appreciated, RIE is a dry etching process that permits highly anisotropic etch profiles and may be performed, for example, using $CF_4$ at 100 mT and 0.21 W/cm². In this regard, the mesa shape of the emitter mesa 104 may be achieved through accurate control of the physical and chemical mechanisms involved with the RIE. For instance, controlling the gas ratios of ions, the flow rate of ions, the chamber pressure, and power/voltage applied to accelerating ions and other factors, may be used to control the RIE rate to form the tapered sidewalls of the emitter mesa 104.

Figure 5:
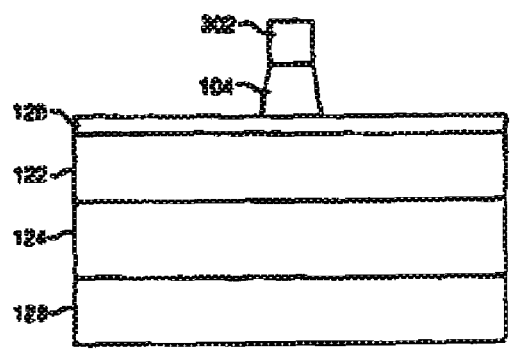
Figure 6:
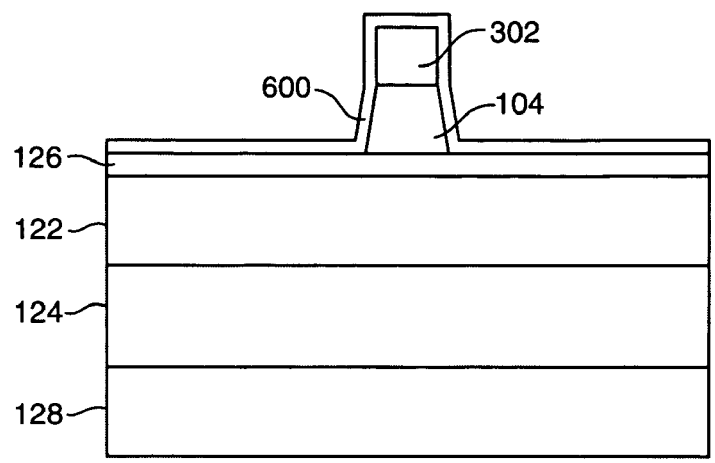
Figure 7:
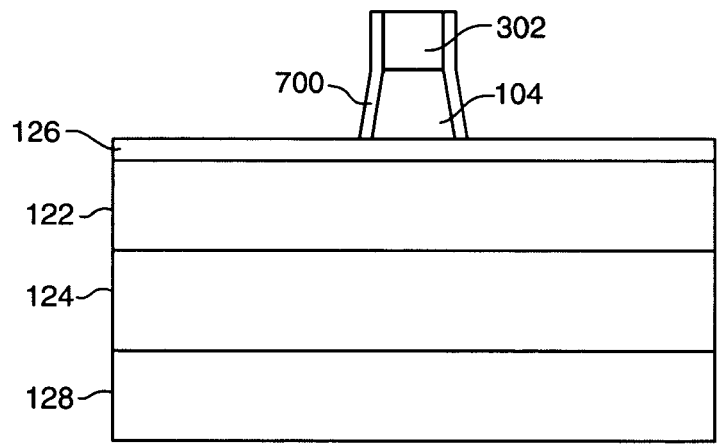
Figure 8:
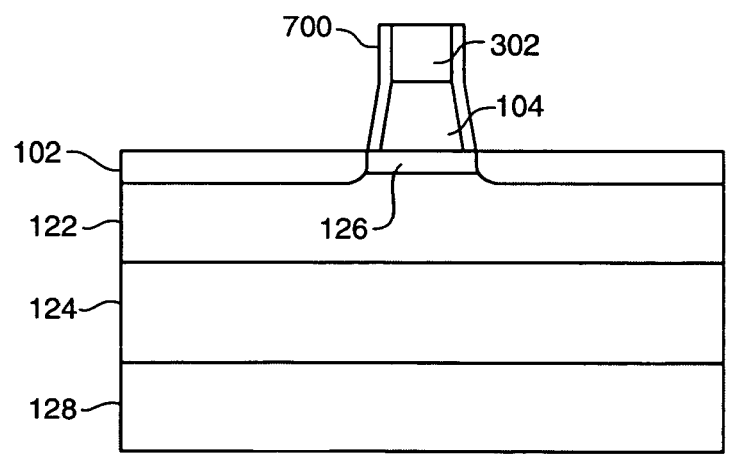

FIG. 5 illustrates the emitter mesa 104 after an RIE etch, to remove the photoresist mask 300. On FIGS. 6 and 7 an oxide layer 600, e.g. $SiO_2$, is deposited on the structure and then partially removed to leave only sidewalls 700. Ion implantation is then performed, as illustrated in FIG. 8, to define the base contact layer 102. Advantageously, the same mask 302 is utilized during both the emitter mesa 104 etch and the ion implant to facilitate self-alignment. Furthermore, the sidewalls 700 permit an accurate self-aligned spacing between the implant area 102 and the emitter mesa 104.

Figure 9:
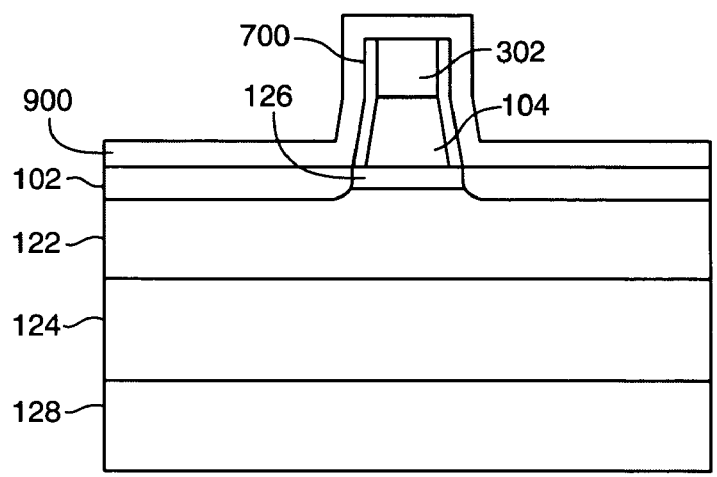
Figure 10:
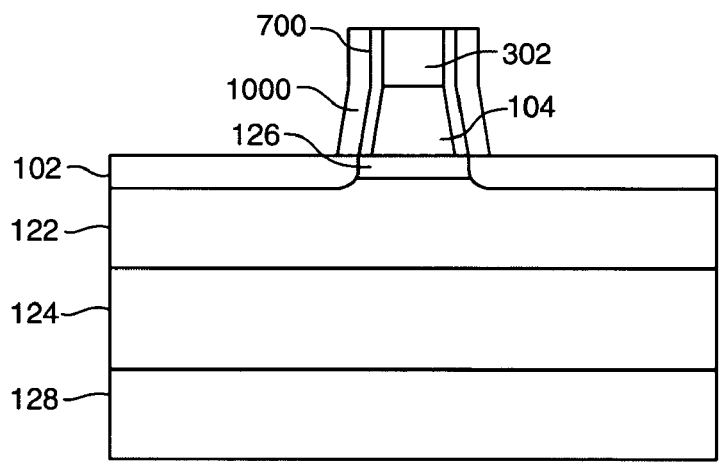
Figure 11:
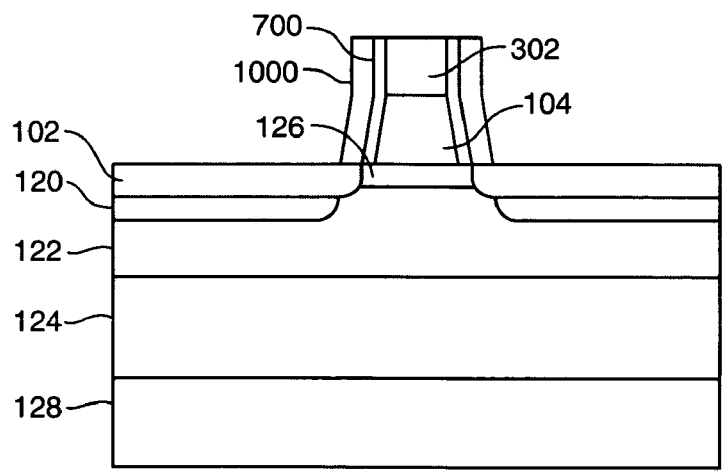
Figure 12:
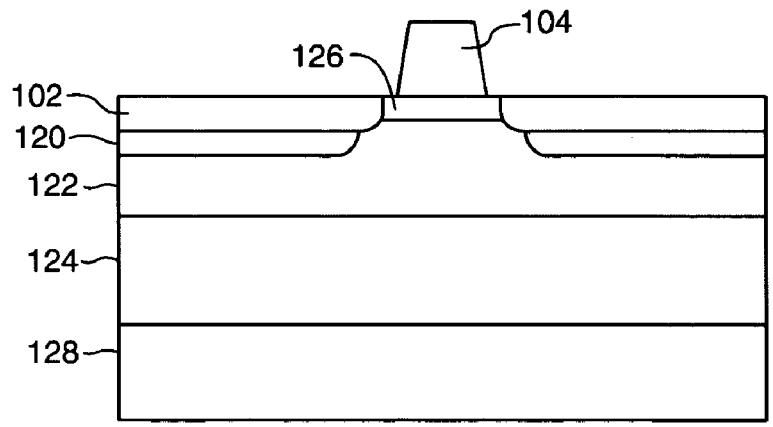

As illustrated on FIGS. 9 and 10, an oxide layer 900, e.g. $SiO_2$, is conformally deposited on the structure, followed by an RIE etch to remove all but the sidewalls 1000 of the layer 900. Oxygen is then implanted to form an oxygen implanted layer 120 under the base contact layer 102 as shown in FIG. 11. As noted above, the layer 120 serves as an insulating layer that reduces base-collector capacitance due to the low dielectric constant of the oxygen implanted layer 120. In this regard, the layer 120 is implanted with a higher implant energy and dose than the base contact layer 102 to reduce the base collector capacitance. As with the sidewalls 700, the sidewalls 1000 permit accurate self-aligned spacing between the implant area 120 and the emitter mesa 104. Following the implant 120, the mask 302 and sidewalls, 1000 and 700, are removed, as shown in FIG. 12. The device 100 may then be annealed in a conventional manner to restore the crystal structure in the device 100.

Figure 13:
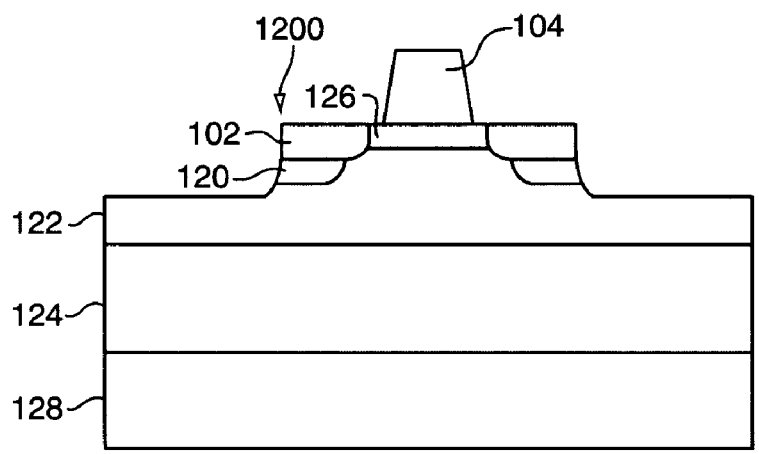
Figure 14:
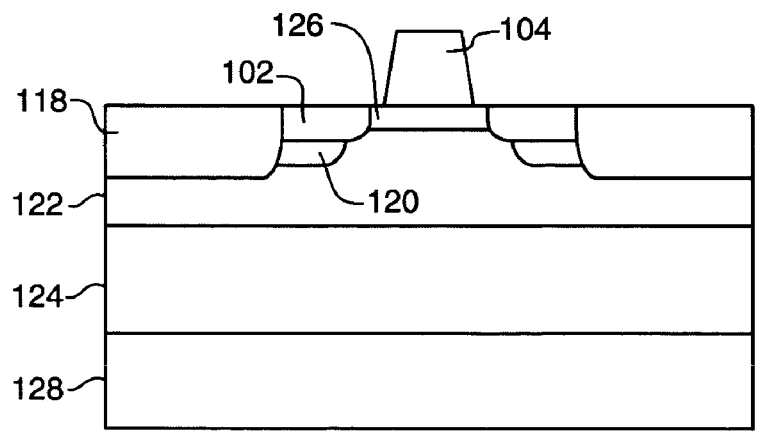

FIG. 13 illustrates the result of an RIE etch of a portion of the base contact layer 102, implanted $O_2$ layer 120, and a portion of collector layer 122 to form an isolation mesa 1200. Advantageously, the isolation mesa 1200 isolates the emitter-base junction from the remainder of the device 100. As illustrated in FIG. 14, the area around the isolation mesa 1200 may be refilled with an oxide, e.g. $SiO_2$, using for example, a CVD or any other suitable process to form the isolation area 118. Other suitable processes may include without limitation, an implant isolation for instance with oxygen, possibly followed by a thermal oxidation and a selective thermal oxidation where a silicon nitride mask is used to cover the base and emitter mesa.

Figure 15:
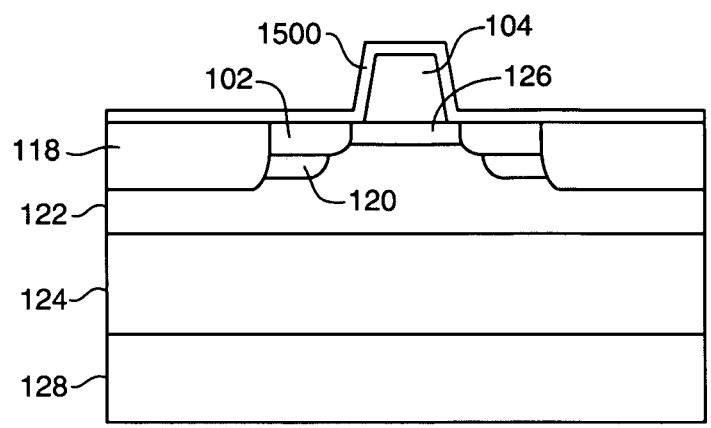
Figure 16:
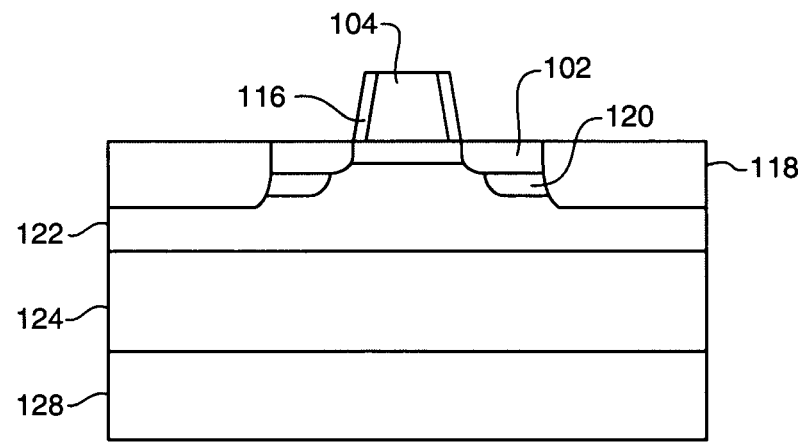
Figure 17:
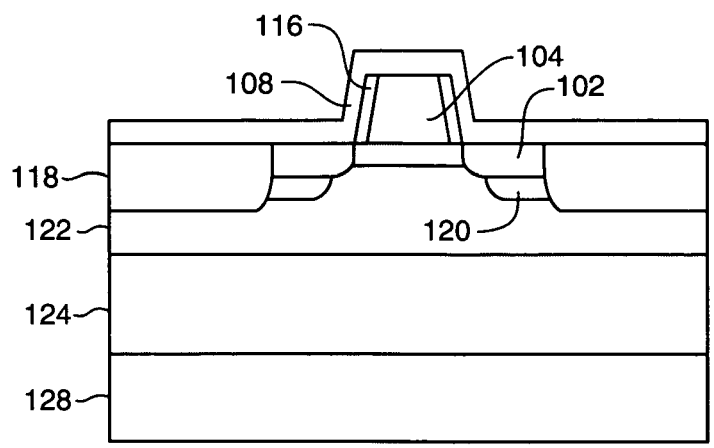

On FIGS. 15 and 16, an oxide layer 1500, e.g. $SiO_2$, is deposited and partially removed to form sidewalls 116 on the emitter mesa 104. As will be appreciated from the following description, the sidewalls 116 facilitate the self-alignment of the base contact metal 108, which is conformally deposited, as illustrated on FIG. 17. The base contact metal 108 may be deposited, using for example, physical vapor deposition (PVD) such as sputtering or another similar process. In one example of the transistor 100, the base contact metal 108 may be Ti/Al, although it will be appreciated that other metals may be utilized as a matter of design choice, with some examples including without limitation, tantalum (Ta), molybdenum (Mo), tungsten (W), chromium (Cr), and silicon (Si).

Figure 18:
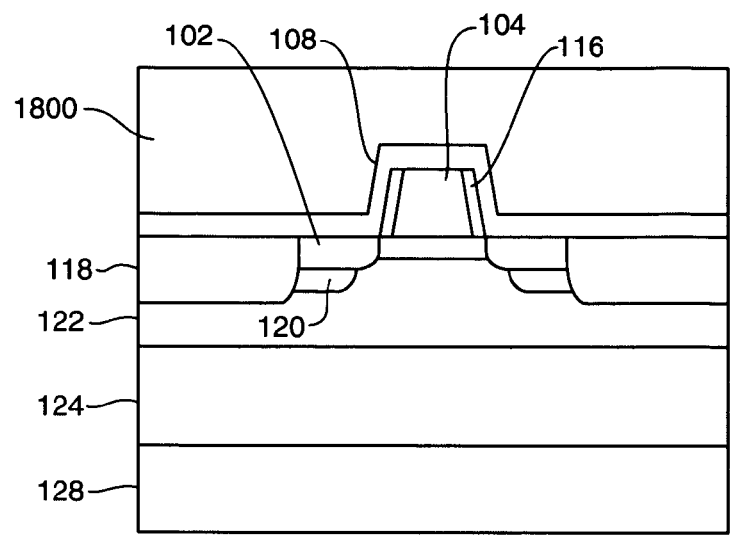

As illustrated in FIG. 18, a polyamide planarization layer 1800 is then deposited over the device 100. The planarization layer 1800 may be formed by a polymer with a planarizing property, such as polyamide spun over the device 100, and planarized by etch back or chemical-mechanical polishing (CMP). As noted, the planarization layer 1800 may be cured, for example, at approximately 200 degrees C., which causes the polyamide to flow so that a minimal surface topology results despite the presence of the emitter mesa 104. Although polyamide is set forth in this example, it will be appreciated that other organic resins such as polyimide, acrylic, BCB (benzocyclobutene), or the like may alternatively be used.

Figure 19:
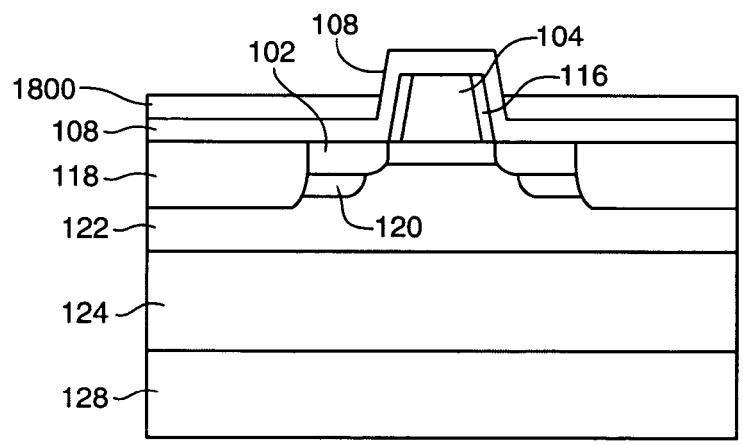
Figure 20:
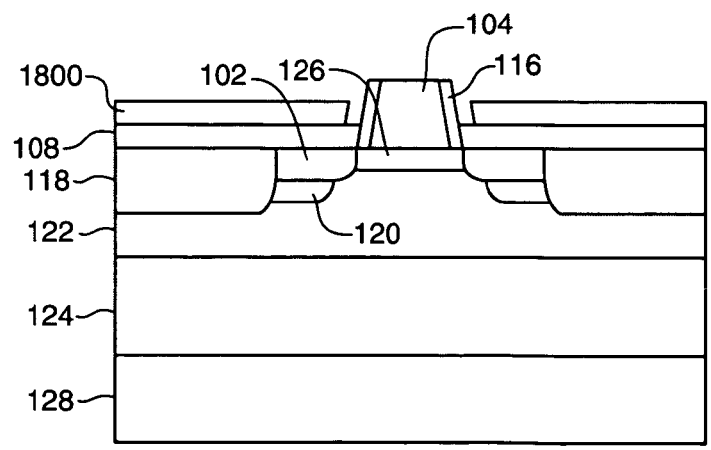

The planarization layer 1800 is then partially removed such as via an $O_2$ RIE etch to expose a top portion of the emitter mesa 104 including the base contact metal 108 as shown in FIG. 19. In this regard, the planarization layer 1800 is preferably etched down below the top level of the emitter mesa 104, to expose an upper portion of the base contact metal 108 along the side and top of the emitter mesa 104. As illustrated in FIG. 20, this permits an etch of the base contact metal 108 to remove a portion of the metal 108 surrounding the emitter mesa 104.

Figure 21:
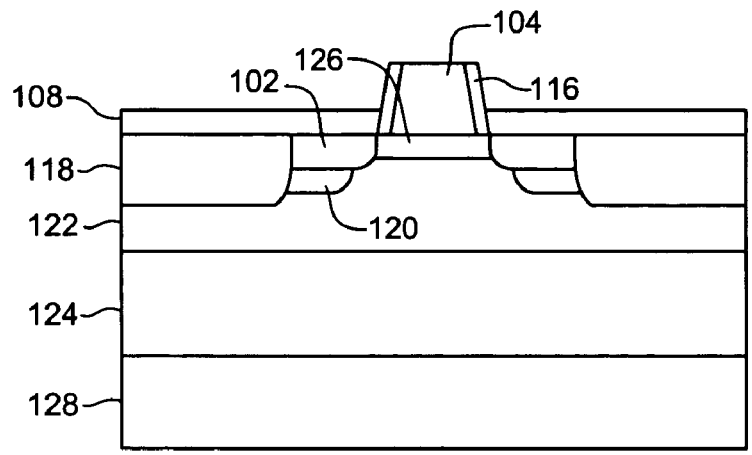
Figure 22:
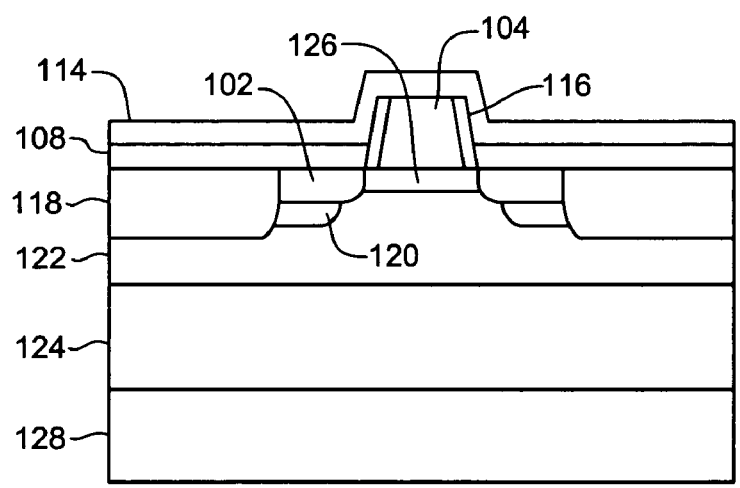
Figure 23:
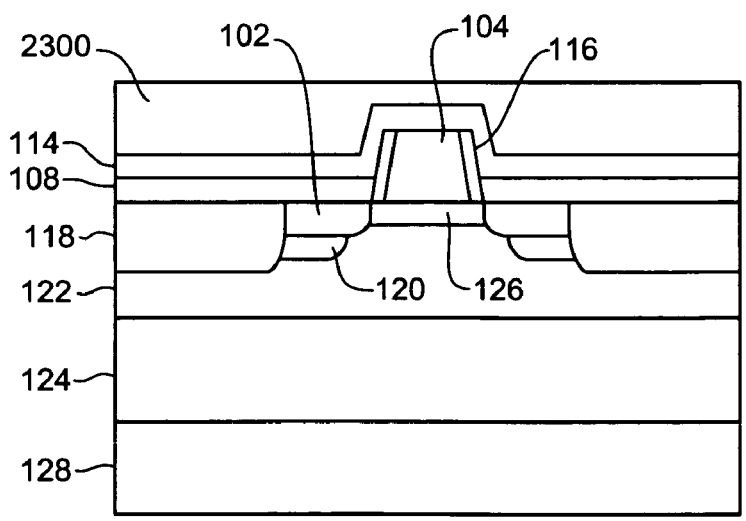
Figure 24:
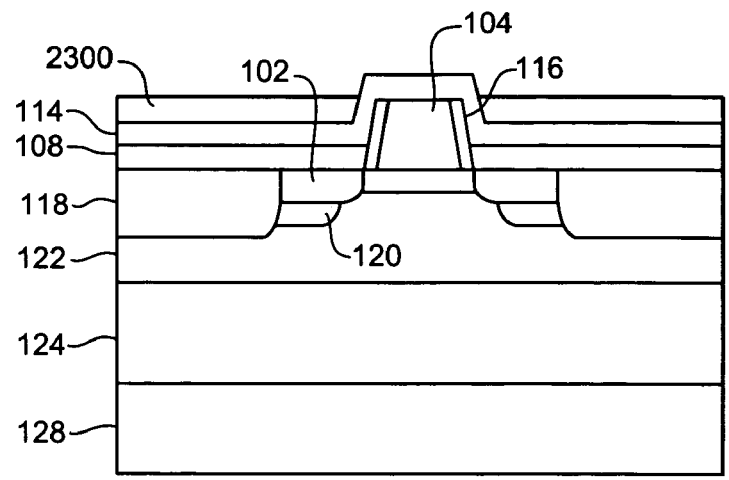
Figure 25:
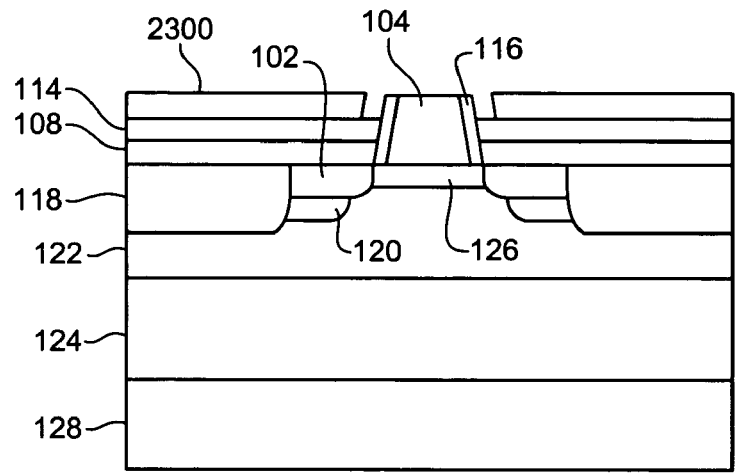
Figure 26:
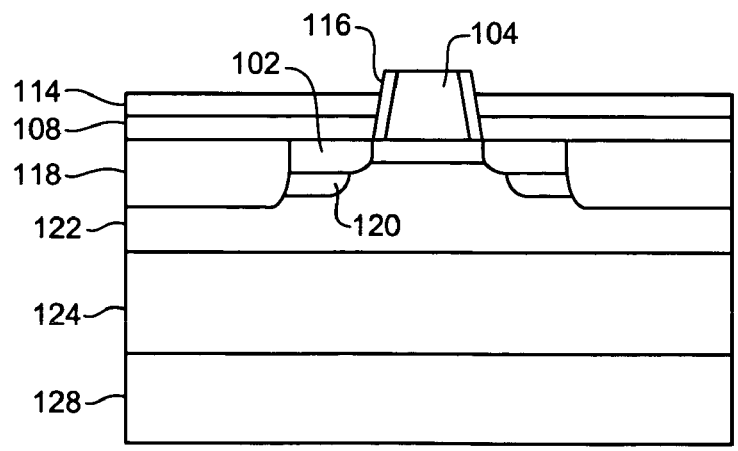

The remainder of the planarization layer 1800 is then removed as shown In FIG. 21. The removal of the layer 1800 may be performed in several ways including wet etching, plasma etching (or reactive ion etching, RIE). After removal of the remaining planarization layer 1800, an oxide layer, for example, a CVD deposited $SiO_2$ layer 114 may be deposited, as illustrated in FIG. 22. As illustrated in FIG. 23, another polyamide planarization layer 2300 is then deposited on the oxide layer 114 to form a conformal coating that facilitates self-alignment of the emitter contact 106. As illustrated in FIG. 24, the planarization layer 2300 is then partially removed, for example by anisotropic oxygen RIE, to expose the top of the emitter mesa 104 and oxide layer 114. This permits an $SiO_2$ etch to expose emitter mesa 104, as illustrated in FIG. 25. As illustrated in FIG. 26, the remaining polyamide layer 2300 may then be removed for application of a self-aligned emitter contact 106 formed thereon, as shown in FIG. 1. Finally, since the substrate 128 is conductive in the above example, a collector contact 110 is applied in a conventional manner to the bottom surface of the substrate 128, as shown in FIG. 1. It will be appreciated, however, that transistor 100 could be constructed with a non-conductive substrate in which case the collector contact 110 may be applied to another conductive surface, for instance sub-collector 124.

Some examples of base and emitter contact metals include without limitation, Nickel (Ni) for the n-type emitter contact 106 and Aluminum alloy (e.g., Al/Ti) for the base contact metal 108. In this regard, the contacts may be either a single layer or a multi-layer laminate type electrode. It should also be noted that a high-temperature anneal of the base and emitter contacts, 106 and 108, may also be required in some cases depending on doping densities of the base contact layer 102 and the emitter 104. Furthermore, the metal used for the base and emitter contacts 106 and 108 is not limited to Nickel and Aluminum alloy, but generally, a high work function metal having a low reactivity or a noble metal is preferred for such ohmic contacts. Some examples of the contact metal may also be selected from the group including but not limited to, Platinum, Platinum silicide, Gold, Palladium, Silver, Chromium, and Tungsten.

It will be appreciated that the above example of the transistor 100 is one of many types of semiconductor devices that may be constructed in accordance with the principles of the present invention. Furthermore, those skilled in the art will appreciate variations of the disclosed processes as well as other similar processes that may be utilized in accordance with the teachings of the present invention to form self-aligned SiC devices having a regrown contact area. Those skilled in the art will further appreciate variations of the above-described embodiments that fall within the scope of the invention.

High Temperature Implant Mask.

According to another embodiment of the present invention, a material, which can withstand the high annealing temperature, is utilized as an ion-implantation mask. This in turn, permits utilization of the masking material subsequent to the annealing process to achieve a self-aligned device. Some examples of such materials include without limitation, carbon, $Al_2O_3$, AlN, BN, tungsten, and diamond. Of note, carbon and diamond are particularly useful since they can be removed selectively using, for example, an oxygen plasma etch. The BJT fabrication process according to the present embodiment is similar to the one described above. The key difference is that the mask is not removed prior to the anneal process step and thus may be utilized in combination with at least one planarization step to construct the device 100 in a self-aligned manner.

Figure 27:
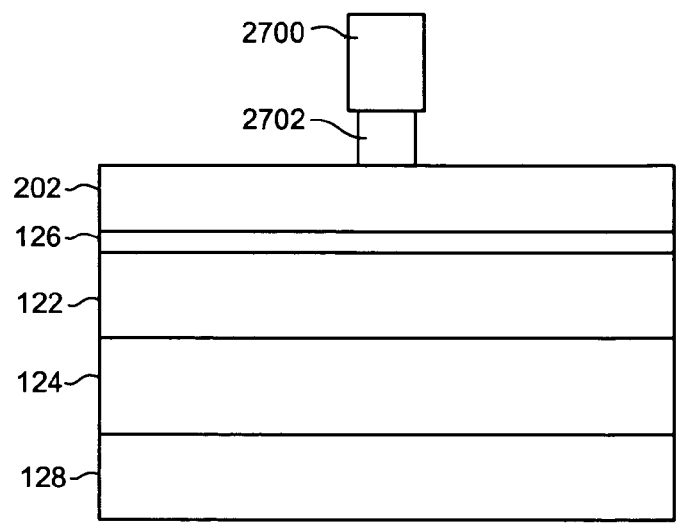
FIGS. 27-49 illustrate, in step-by-step fashion, another process for forming the device of FIG. 1.
Figure 28:
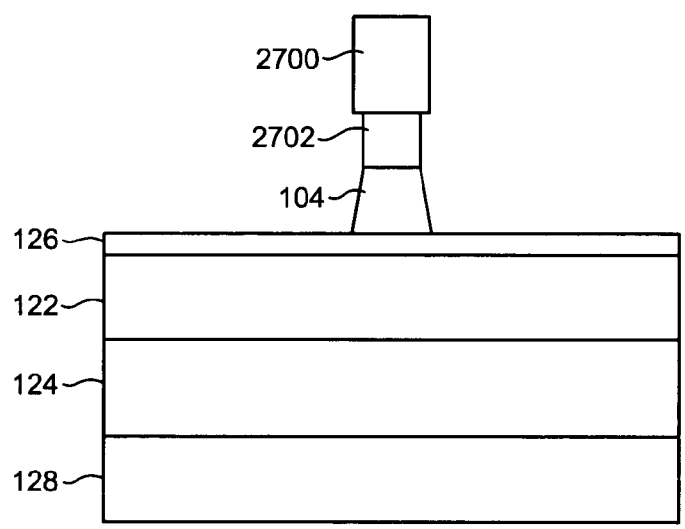
Figure 29:
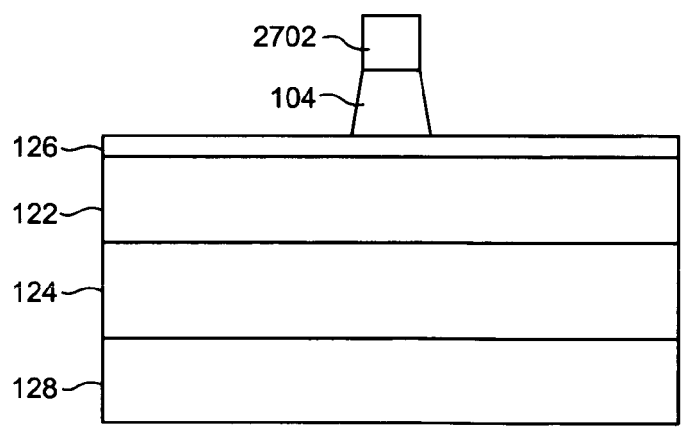
Figure 30:
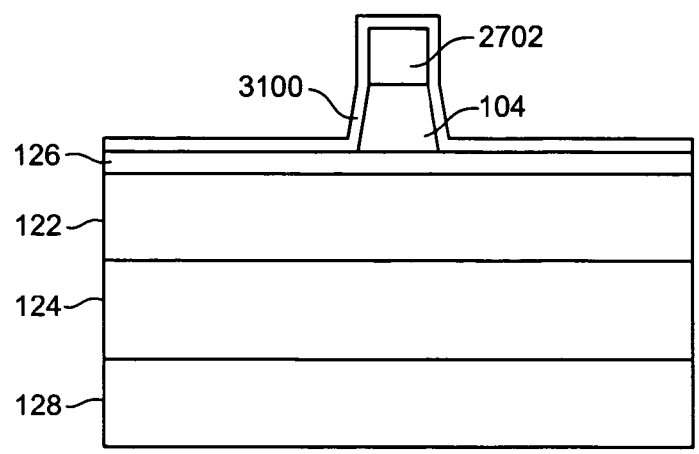
Figure 31:
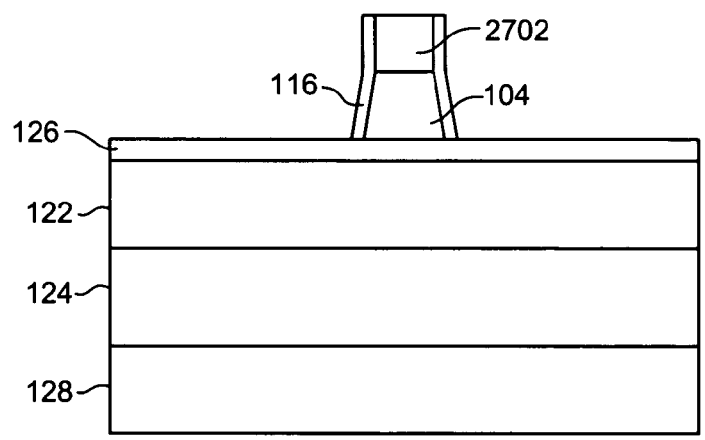
Figure 32:
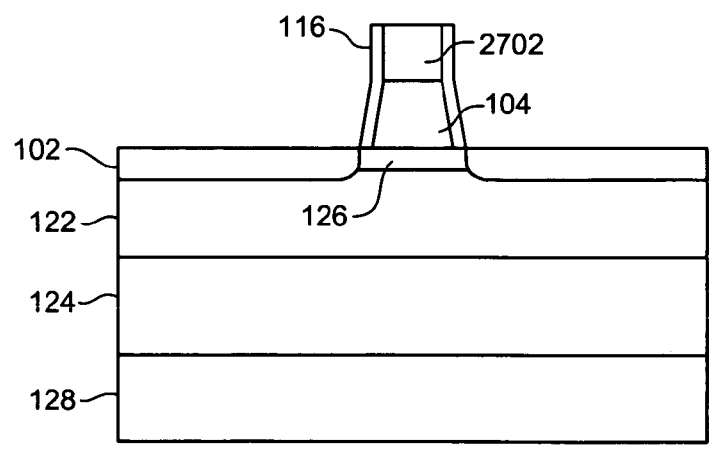
Figure 33:
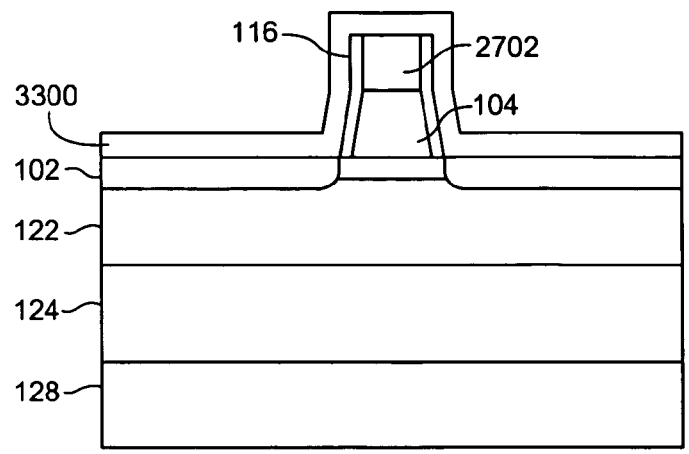
Figure 34:
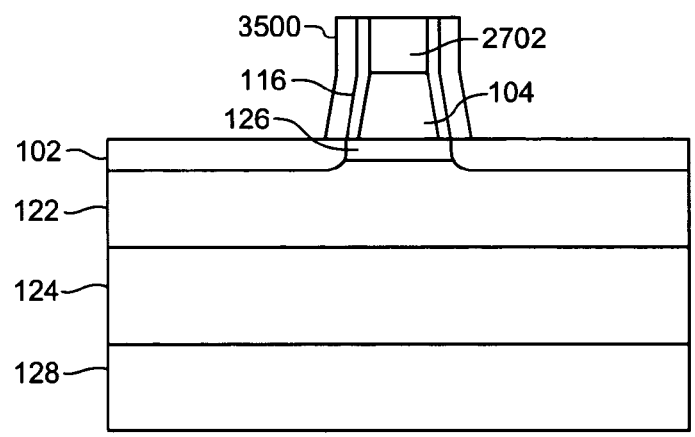
Figure 35:
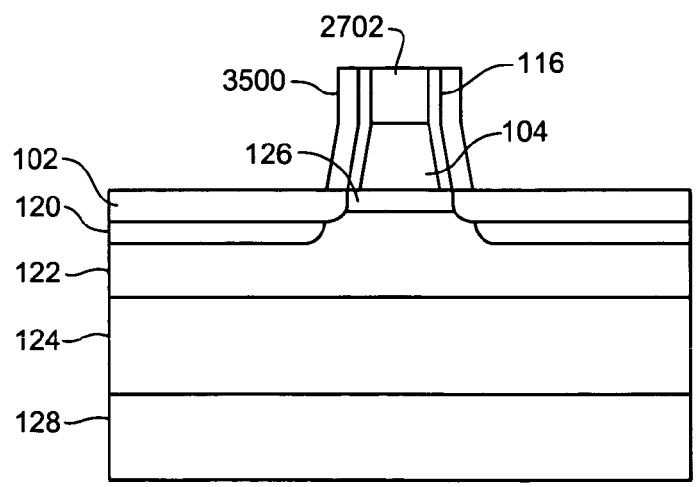

A corresponding process is shown in step-by-step fashion in FIGS. 27-49. As with the above embodiment the process begins with an epitaxially grown SiC stack, such as stack 200 shown in FIG. 2. In this regard, FIG. 27 illustrates application of a photoresist mask 2700 and an implant mask 2702. For purpose of illustration, the implant mask 2702 according to this example may be formed from an amorphous carbon, which may be applied using standard photolithographic techniques. FIG. 28 illustrates the emitter mesa 104 after an RIE etch such as described above, and FIG. 29 shows the mesa 104 after removal of the photoresist mask 2700. A conformal carbon layer 3100 is then deposited, as shown in FIG. 30, and partially removed via an $O_2$ RIE etch such that carbon sidewalls 116 remain as shown in FIG. 31. Ion implantation is then performed, as illustrated in FIG. 32, to define the base contact layer 102. A conformal carbon layer 3200 is then deposited over the structure as shown in FIG. 33 and partially removed to provide carbon sidewalls 3500 as shown in FIG. 34. Oxygen is then implanted to form an $O_2$ implanted layer 120 under the base layer 102, as shown in FIG. 35. The structure of FIG. 35 is then annealed in, for example, a silane atmosphere in the temperature range of 1400-1800° C. Advantageously, the implant mask 2702 and carbon sidewalls 3500 and 116 are not removed prior to the anneal step, and as will be appreciated from the following description are utilized to facilitate the construction of the device 100 in a self-aligned manner.

Figure 36:
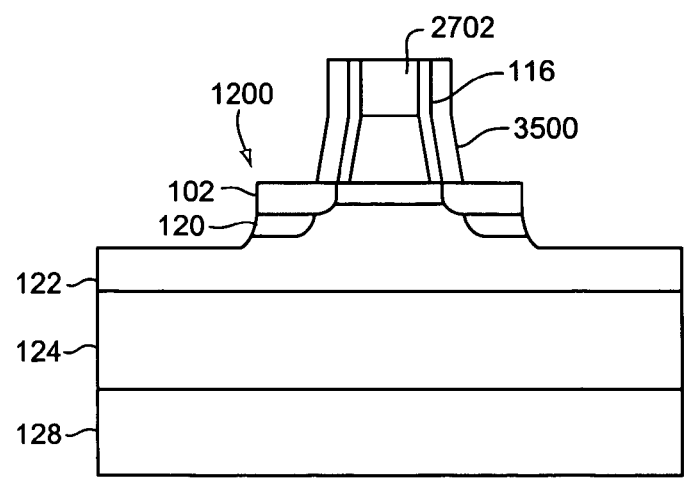
Figure 37:
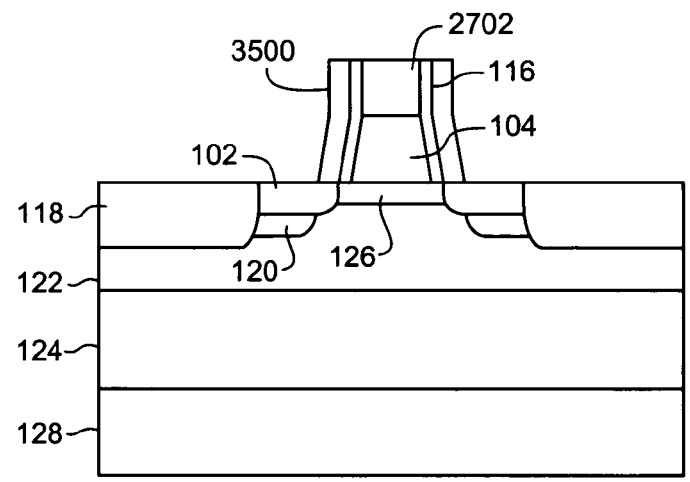
Figure 38:
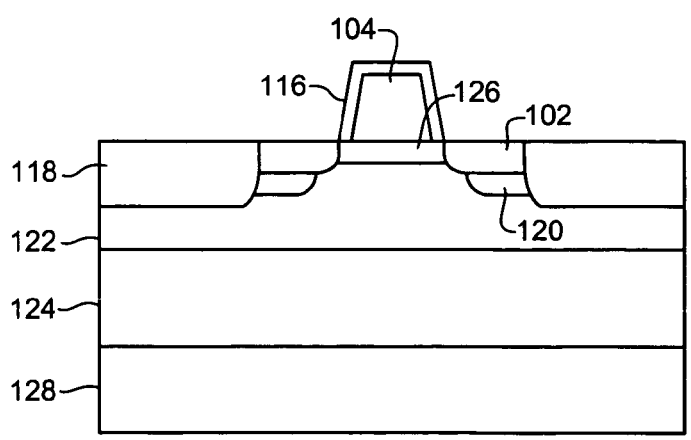
Figure 39:
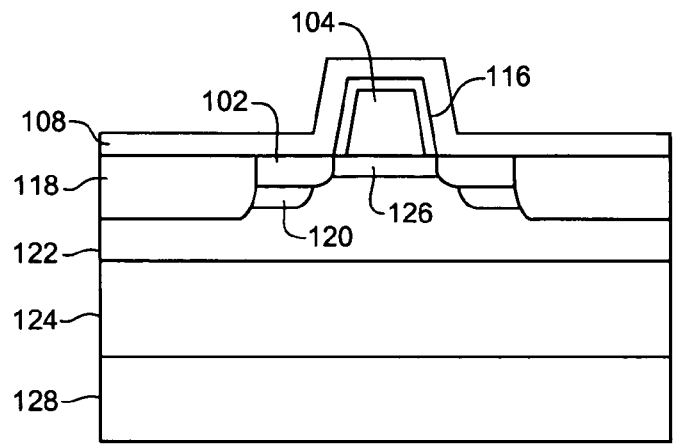
Figure 40:
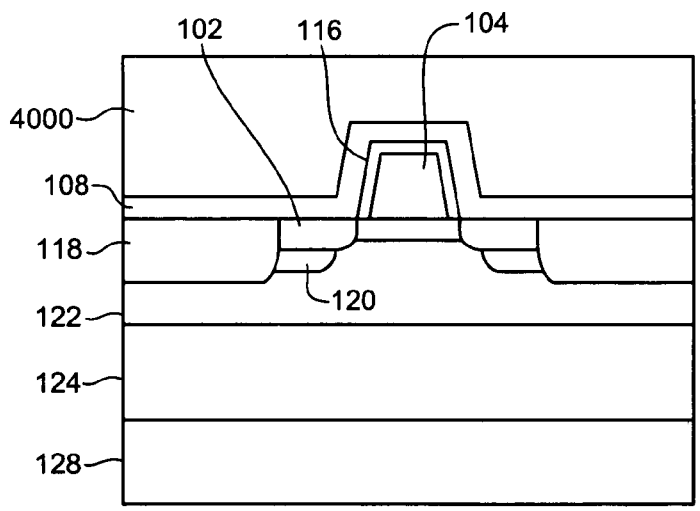
Figure 41:
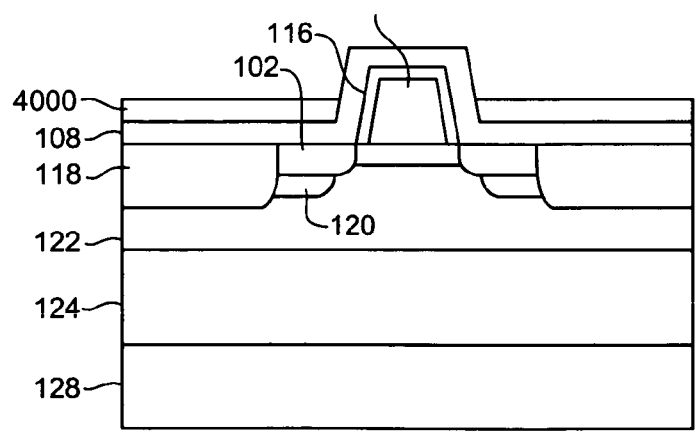
Figure 42:
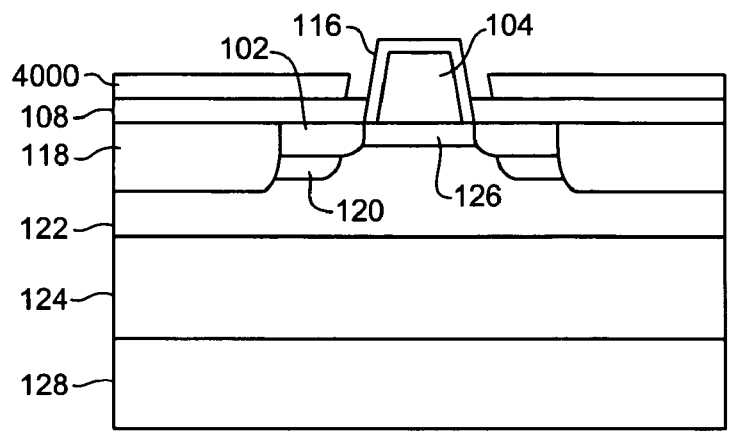
Figure 43:
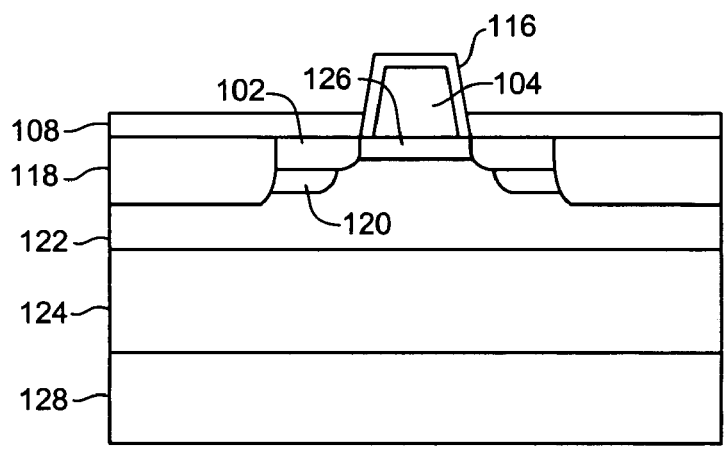
Figure 44:
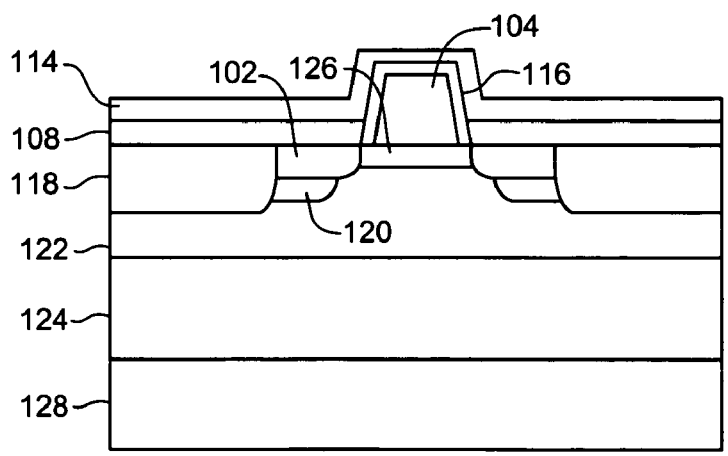
Figure 45:
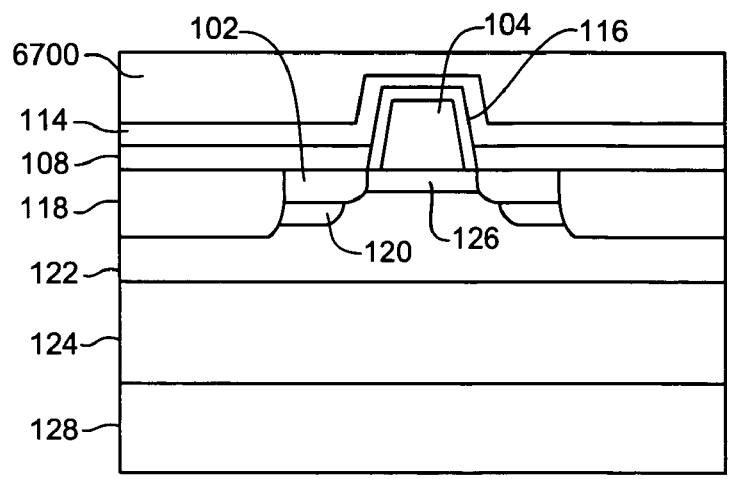
Figure 46:
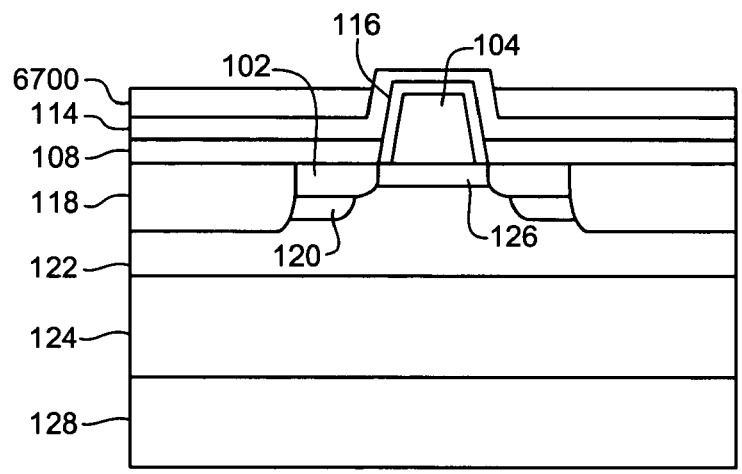

FIG. 36 illustrates the result of an RIE etch of a portion of the base contact layer 102, implanted $O_2$ layer 120, and a portion of collector layer 122 to form the isolation mesa 1200. As noted above, the isolation mesa 1200 isolates the emitter-base junction from the remainder of the device 100. As illustrated in FIG. 37, the area around the isolation mesa 1200 may be refilled with an oxide, e.g. $SiO_2$, using for example, a CVD or any other suitable process to form the isolation layer 118. The carbon sidewalls 3500 and most of the implant mask 2702 are then removed as shown in FIG. 38. It should be noted that since the carbon implant mask 2702 and carbon sidewalls 116 are the same material, they are illustrated on FIG. 38 as a unitary layer indicated by numeral 116. As illustrated on FIG. 39, the base contact metal 108, e.g. Ti/A, is deposited over the structure. As with the above embodiment, a planarization layer 4000 is formed (FIG. 40) and partially removed by an RIE etch (FIG. 41). This in turn permits the etch of the base metal 108 to remove the metal 108 surrounding the emitter mesa 104 (FIG. 42). The remainder of the planarization layer 4000 is then removed (FIG. 43), and the oxide layer 114 is CVD deposited on the structure as shown in FIG. 44.

Figure 47:
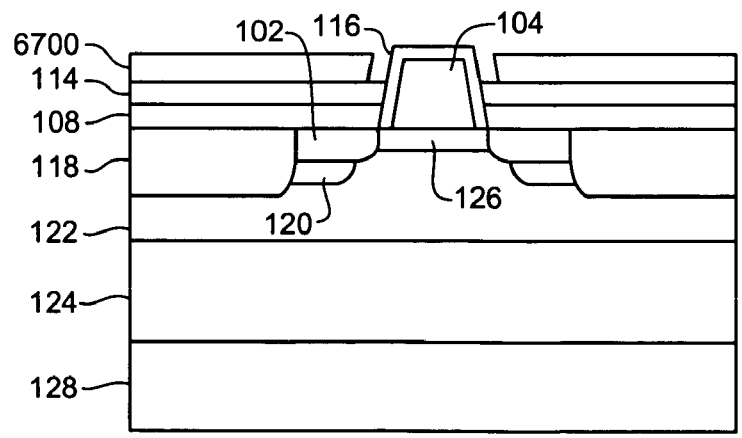
Figure 48:
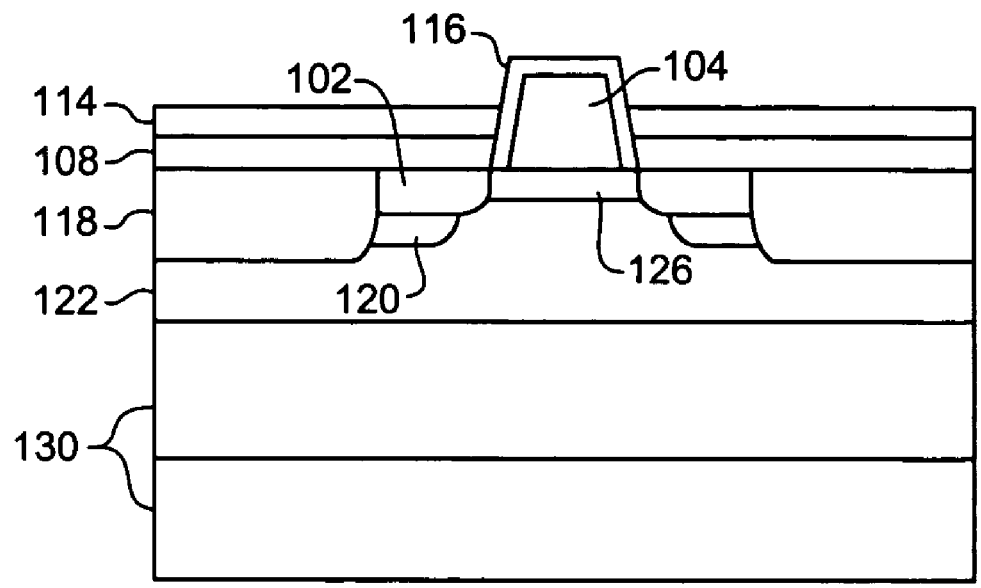
Figure 49:
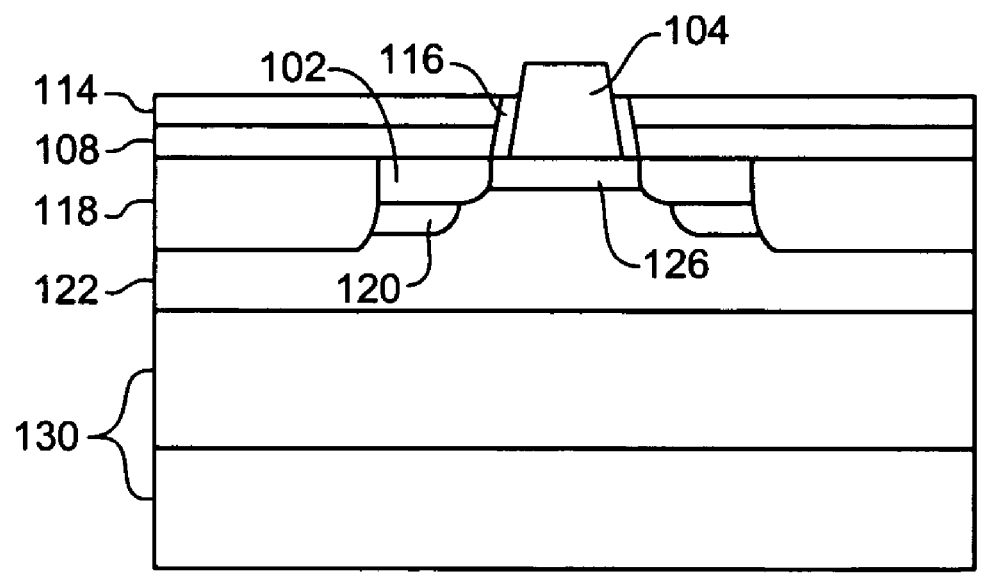
Figure 50:
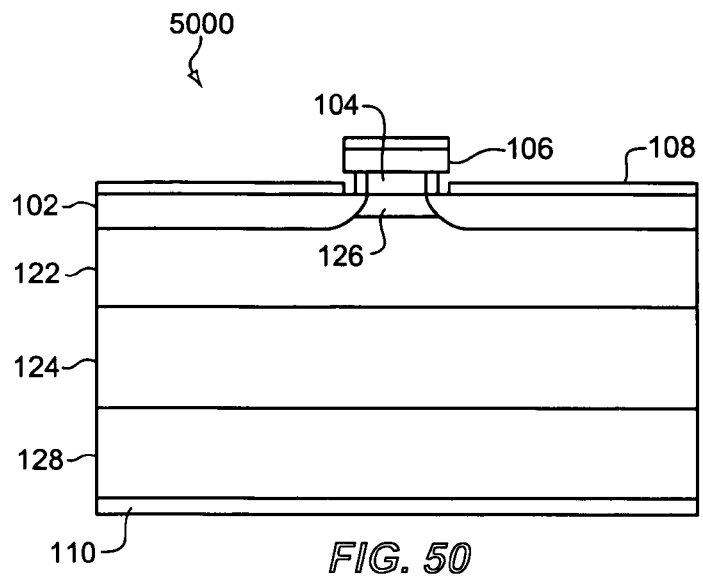
FIG. 50 is a cross sectional schematic view of another SiC-based BJT structure formed in accordance with the present invention.

A second polyamide planarization layer 6700 is then deposited (FIG. 45) and partially removed by planarization (FIG. 46) to facilitate the self-alignment of the emitter contact 106. As with the above embodiment, FIG. 47 illustrates an $SiO_2$ etch which is followed by removal of the planarization layer 6700 as shown in FIG. 48. Of note, unlike the above embodiment, according to this embodiment, the carbon cap on the emitter mesa 104 is removed (FIG. 49) down to the oxide layer 114 such as by an $O_2$RIE. This permits application of the emitter contact 106, such as by deposition of a contact metal, e.g. Ni, over a larger portion of the emitter mesa 104, as shown in FIG. 1. Finally, as with the above embodiment, the collector contact 110 may be applied to the bottom surface of the substrate 128.

Implant First Structure.

According to another embodiment of the present invention, ion implantation of the base layer 126 is performed prior to the formation of the emitter mesa 104 to achieve a self aligned SiC BJT device, namely device 5000. As with the device 100, the device 5000 includes an emitter, e.g. emitter mesa 104, a base 126, and a collector 130 (including collector layer 122 and subcollector layer 124). The transistor 5000 also includes a substrate 128, collector contact 110, and the emitter and base contacts 106 and 108.

Figure 51:
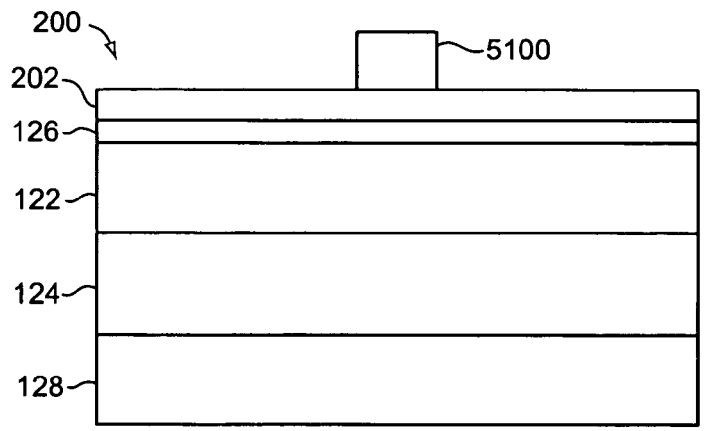
FIGS. 51-58 illustrate, in step-by-step fashion, a process for forming the device of FIG. 50.
Figure 52:
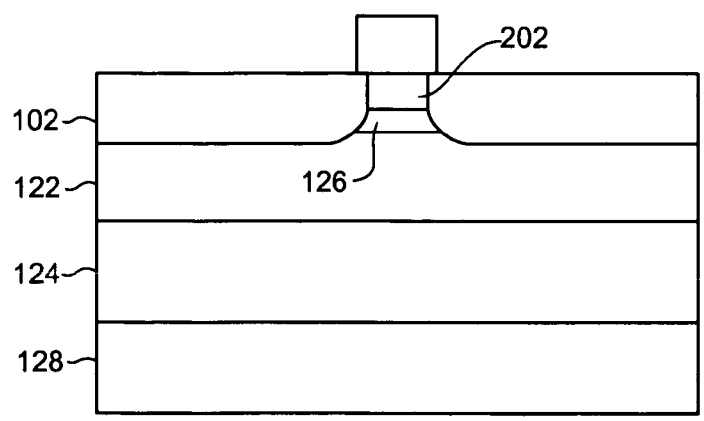
Figure 53:
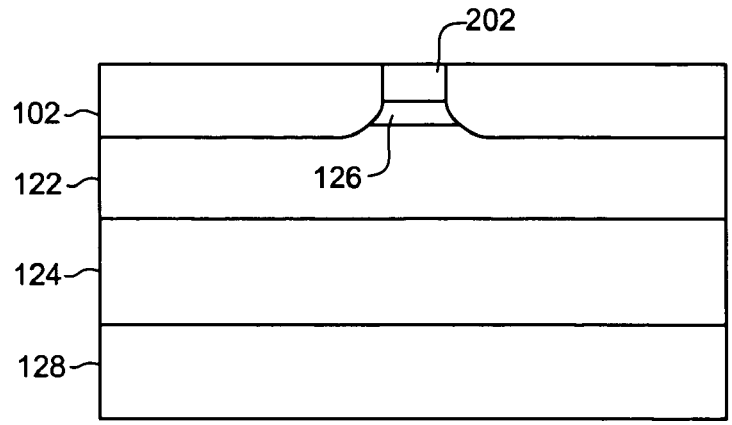

An example of a corresponding process for constructing the device 5000 is shown in step-by-step fashion in FIGS. 50-58. As with the above embodiment the process begins with an epitaxially grown SiC stack, such as stack 200 shown in FIG. 2. In this regard, FIG. 51 illustrates application of an implant mask 5100, e.g. SiO$_2$, formed on the stack 200. Ion implantation is then performed, (FIG. 52), to define the heavily doped base contact layer 102. The implant mask 5100 may then be removed and the implanted region annealed in, for example, a silan atmosphere in the temperature range of 1400-1800° C. as shown in FIG. 53.

Figure 54:
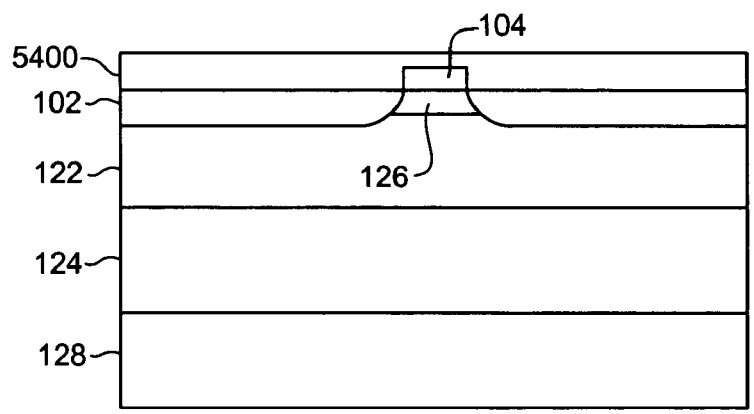

Subsequent to the implantation and anneal, selective thermal oxidation is performed on the structure to form the emitter mesa 104 as shown in FIG. 54. Specifically, due to the higher oxidation rate of the highly doped p-type layer 102, the layer 102 oxidizes faster so that the implanted emitter layer 202 is completely removed leaving only the non-implanted portion of the emitter layer 202, thereby defining the emitter mesa 104. Alternatively, it will be appreciated that a selective etch that removes p-type SiC faster than n-type SiC may also be utilized in place of the thermal oxidation step.

Figure 55:
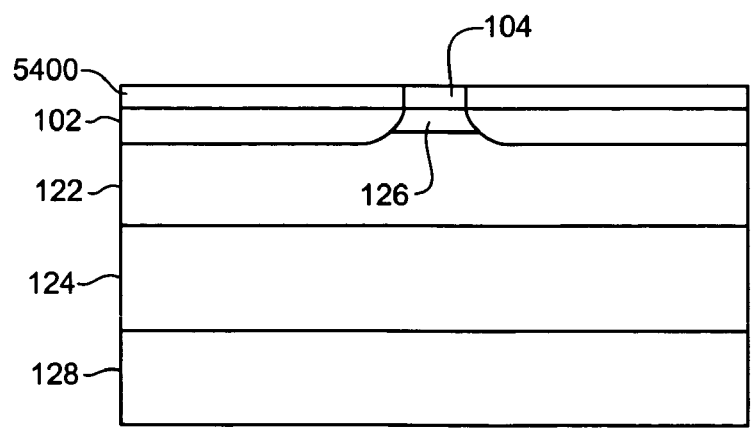
Figure 56:
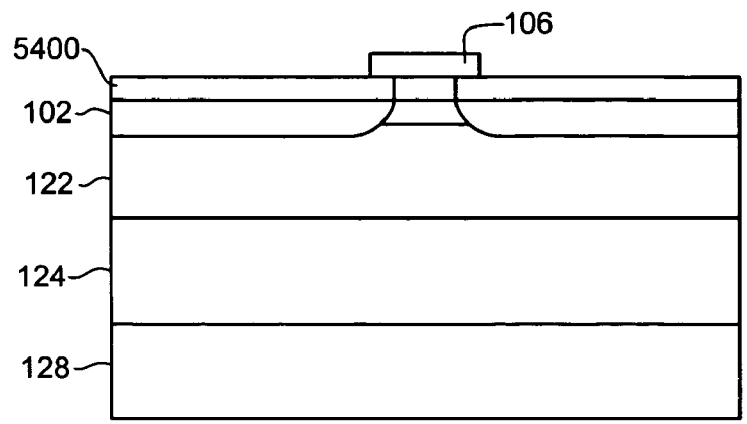
Figure 57:
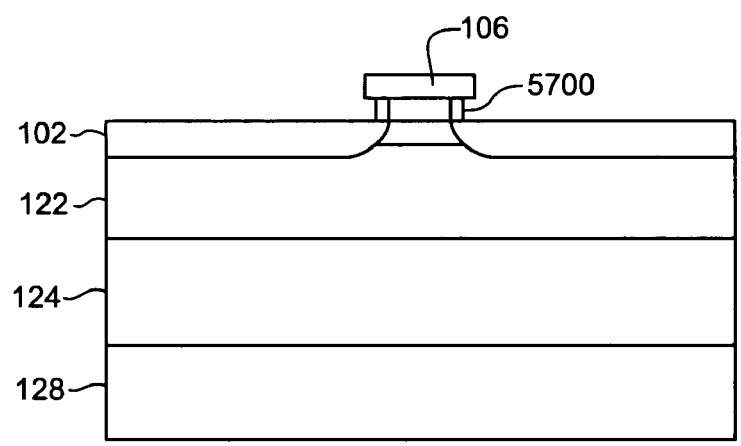
Figure 58:
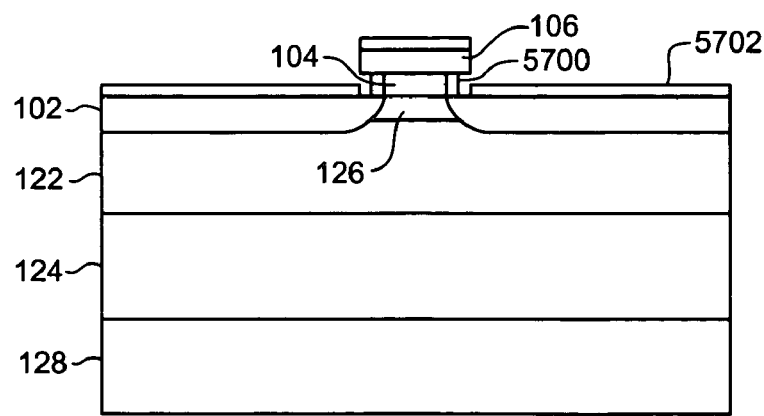

As shown in FIGS. 55 and 56 a partial removal of the oxide layer 5400 exposes the emitter mesa 104 for deposition of the emitter contact metal 106, e.g. Ni. As shown in FIG. 57, the emitter contact 106 may then be utilized as an RIE etch mask to remove the remaining oxide 5400 on top of the base contact layer 102, leaving only sidewalls 5700. Base contact metal 5702 may then be deposited on the device as shown in FIG. 58. Advantageously, this results in a close proximate spacing between the base and emitter contact metals 106 and 5702 respectively.

While various embodiments of the present invention have been described in detail, it is apparent that further modifications and adaptations of the invention will occur to those skilled in the art, and it should be expressly understood that such modifications and adaptations are within the spirit and scope of the present invention. In addition, it will be appreciated that the above examples are provided for purpose of illustration and that other devices are possible and contemplated in accordance with the present invention. For instance, one skilled in the art will readily appreciate that the described principles may be applied to construct devices such as a junction, a diode, a thyristor, etc. from SiC.

What is claimed:

1. A Silicon-Carbide (SiC) device, comprising:
    a mesa structure;
    a sidewall on said mesa structure; and
    a base contact metal;
    wherein a lower end of said sidewall is in substantially the same plane as a lower boundary of said base contact metal;
    wherein an upper end of said sidewall is at a plane above an upper boundary of said base contact metal.

2. The device of claim 1, further including an emitter contact metal on said mesa structure;
    wherein said emitter contact metal includes a top surface, a bottom surface and a lateral surface extending between said top and bottom surfaces of said emitter contact metal; and
    wherein said base contact metal includes a top surface, a bottom surface and a lateral surface extending between said top and bottom surfaces of said base contact metal;
    wherein said lateral surface of said emitter contact metal extended downward is substantially aligned with said lateral surface of said base contact metal.

3. The device of claim 1, further including a transition between regions of differing doping density substantially defined by a transition surface, said transition surface being substantially aligned with a surface of said sidewall.

4. The device of claim 1, further including an area of contact between said sidewall and a metal contact.

5. The device of claim 1, wherein said upper end of said sidewall is at a plane lower than an upper end of said the emitter mesa.

6. The device of claim 1, wherein said sidewall comprises a material capable of withstanding 1800 C in a silane atmosphere.

7. The device of claim 3, wherein said surface of said sidewall is an outer surface of said sidewall.

8. The device of claim 3, wherein said surface of said sidewall is an inner surface of said sidewall.

9. The device of claim 3, wherein said transition surface and said surface of said sidewall meet a substantially horizontal surface.

10. The device of claim 9, wherein said transition surface, said surface of said sidewall and said horizontal surface collectively and at least partially bound a base contact metal, a base contact and a base.

11. The device of claim 9, wherein said transition surface, said surface of said sidewall and said horizontal surface collectively and at least partially bound an emitter mesa, a base and a base contact.

12. The device of claim 4, wherein said area of contact is proximate to an area of the upper surface of a metal contact said upper surface having a first surface patterning at a first area thereof and a second surface patterning, different that said first surface patterning at a second area thereof, wherein said first area is closer to said sidewall than is said second area.

13. The device of claim 12, wherein a difference of surface patterning as between said first and second areas relates to pitting, mouse bites or etching artifacts.

14. The device of claim 6, wherein said material is one of: carbon, Al2O3, AlN, BN, tungsten and diamond.

15. A Silicon-Carbide (SiC) device, comprising:
    a mesa structure;
    a sidewall on said mesa structure;
    an emitter contact metal on said mesa structure;
    wherein said emitter contact metal includes a top surface, a bottom surface and a lateral surface extending between said top and bottom surfaces of said emitter contact metal; and
    a base contact metal;
    wherein said base contact metal includes a top surface, a bottom surface and a lateral surface extending between said top and bottom surfaces of said base contact metal;
    wherein said lateral surface of said emitter contact metal extended downward is substantially aligned with said lateral surface of said base contact metal.

16. The device in claim 15, wherein a lower end of said sidewall is in substantially the same plane as a lower boundary of said base contact metal;
    wherein an upper end of said sidewall is at a plane above an upper boundary of said base contact metal.

17. The device in claim 15, further including a transition between regions of differing doping density substantially defined by a transition surface, said transition surface being substantially aligned with a surface of said sidewall.

18. The device of claim 15, further including an area of contact between said sidewall and a metal contact.

19. The device of claim 17, wherein said surface of said sidewall is an outer surface of said sidewall.

20. The device of claim 17, wherein said surface of said sidewall is an inner surface of said sidewall.

21. The device of claim 17, wherein said transition surface and said surface of said sidewall meet a substantially horizontal surface.

22. The device of claim 21, wherein said transition surface, said surface of said sidewall and said horizontal surface collectively and at least partially bound a base contact metal, a base contact and a base.

23. The device of claim 21, wherein said transition surface, said surface of said sidewall and said horizontal surface collectively and at least partially bound an emitter mesa, a base and a base contact.

24. The device of claim 18, wherein said area of contact is proximate to an area of the upper surface of a metal contact said upper surface having a first surface patterning at a first area thereof and a second surface patterning, different that said first surface patterning at a second area thereof, wherein said first area is closer to said sidewall than is said second area.

25. The device of claim 24, wherein a difference of surface patterning as between said first and second areas relates to pitting, mouse bites or etching artifacts.

* * * * *